(12) United States Patent
Kim et al.

(10) Patent No.: US 12,175,895 B2
(45) Date of Patent: Dec. 24, 2024

(54) SUBSTRATE FOR DISPLAY

(71) Applicant: LG INNOTEK CO., LTD., Seoul (KR)

(72) Inventors: Hae Sik Kim, Seoul (KR); Duck Hoon Park, Seoul (KR); Hyun Joon Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 768 days.

(21) Appl. No.: 17/284,532

(22) PCT Filed: Jan. 22, 2020

(86) PCT No.: PCT/KR2020/001049
§ 371 (c)(1),
(2) Date: Apr. 12, 2021

(87) PCT Pub. No.: WO2020/153732
PCT Pub. Date: Jul. 30, 2020

(65) Prior Publication Data
US 2021/0383732 A1 Dec. 9, 2021

(30) Foreign Application Priority Data
Jan. 25, 2019 (KR) .................. 10-2019-0009764

(51) Int. Cl.
*G09F 9/30* (2006.01)
*C22C 38/18* (2006.01)
*H10K 71/20* (2023.01)

(52) U.S. Cl.
CPC .............. *G09F 9/301* (2013.01); *C22C 38/18* (2013.01); *H10K 71/233* (2023.02)

(58) Field of Classification Search
CPC ....... G09F 9/301; C22C 38/18; H01L 27/124; H10K 71/233
See application file for complete search history.

(56) References Cited

U.S. PATENT DOCUMENTS 6,208,400 B1  3/2001  Kameyama et al.
8,961,713 B2  2/2015  Yamada et al.
(Continued)

FOREIGN PATENT DOCUMENTS

| CN | 1166615 | 12/1997 |
| CN | 102543861 | 7/2012 |

(Continued)

OTHER PUBLICATIONS

AZO materials. "Grade 304 Stainless Steel: Properties, Fabrication and Applications" May 18, 2005 (Year: 2005).*

(Continued)

*Primary Examiner* — Eric K Ashbahian
(74) *Attorney, Agent, or Firm* — KED & Associates LLP

(57) ABSTRACT

A display substrate according to the embodiment includes a base material containing chromium and iron, wherein the base material includes a surface portion and a central portion, the surface portion is defined as a depth region from a surface of the base material to a depth of 5 nm in a thickness direction of the base material, and a ratio of chromium atoms to iron atoms (Cr/Fe) of the surface portion is greater than that of the central portion.

7 Claims, 11 Drawing Sheets

(56) References Cited

U.S. PATENT DOCUMENTS

| | | |
|---|---|---|
| 9,024,312 B2 | 5/2015 | Fukuda et al. |
| 9,476,110 B2 | 10/2016 | Hattendorf et al. |
| 10,269,280 B2 | 4/2019 | Oh |
| 10,670,892 B2 | 6/2020 | Nakazawa et al. |
| 2016/0066409 A1 | 3/2016 | Kwon et al. |
| 2016/0357052 A1* | 12/2016 | Kim ................ H10K 50/84 |
| 2017/0121797 A1 | 5/2017 | Breuer et al. |
| 2017/0307929 A1 | 10/2017 | Nakazawa et al. |
| 2018/0219201 A1 | 8/2018 | Kim et al. |
| 2019/0019450 A1 | 1/2019 | Ahn et al. |
| 2019/0036068 A1 | 1/2019 | Kim et al. |
| 2020/0229312 A1* | 7/2020 | Ha ................ G06F 1/1681 |
| 2022/0010451 A1* | 1/2022 | Kim ................ C22C 38/04 |

FOREIGN PATENT DOCUMENTS

| | | |
|---|---|---|
| CN | 102576735 | 7/2012 |
| CN | 104979490 | 10/2015 |
| CN | 106057667 | 10/2016 |
| CN | 106450024 | 2/2017 |
| CN | 107925040 | 4/2018 |
| CN | 208376156 | 1/2019 |
| JP | 2008-274386 | 11/2008 |
| JP | 2011-097007 | 5/2011 |
| JP | 2013-129896 | 7/2013 |
| JP | 2016-216782 | 12/2016 |
| KR | 10-2008-0023612 | 3/2008 |
| KR | 10-2013-0008926 | 1/2013 |
| KR | 10-1540163 | 7/2015 |
| KR | 10-2015-0093258 | 8/2015 |
| KR | 10-1722936 | 4/2017 |
| KR | 10-2016-0130876 | 3/2018 |
| KR | 10-1834793 | 3/2018 |
| TW | 201802559 | 1/2018 |

OTHER PUBLICATIONS

European Search Report issued in Application No. 20744548.7 dated Aug. 19, 2022.
Japanese Office Action dated Jul. 11, 2023 issued in Application No. 2022-161014.
Taiwanese Office Action dated Aug. 21, 2023 issued in Application No. 109102284.
Japanese Office Action dated May 24, 2022.
Chinese Office Action issued in Application No. 202080011003.9 Aug. 3, 2022.

* cited by examiner

[FIG. 1]
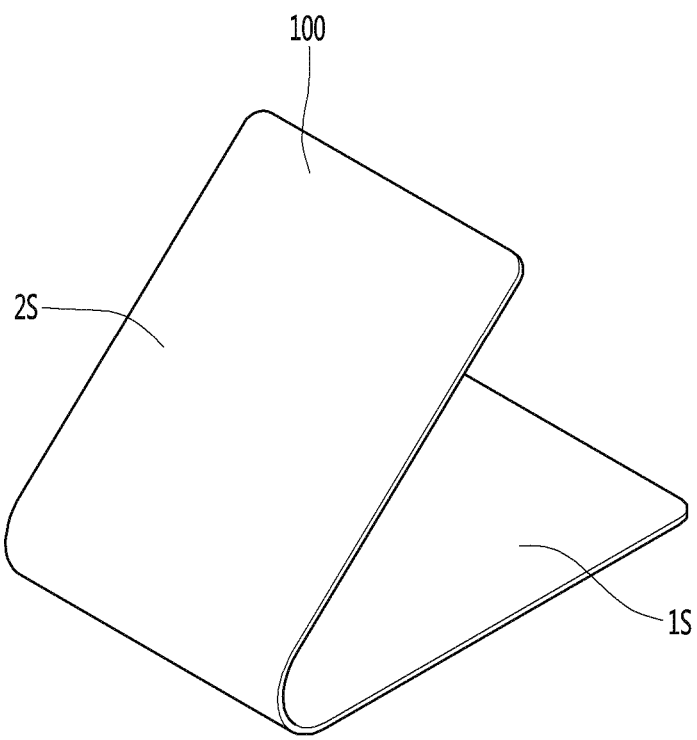

[FIG. 2]
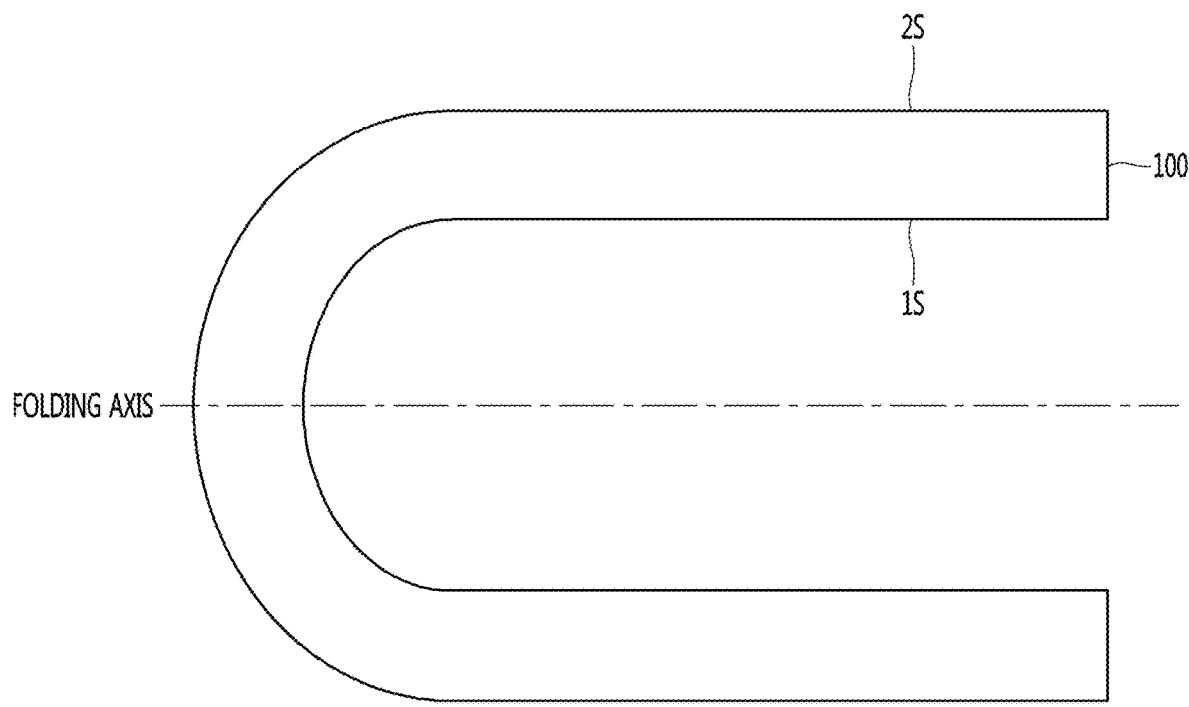

[FIG. 3]
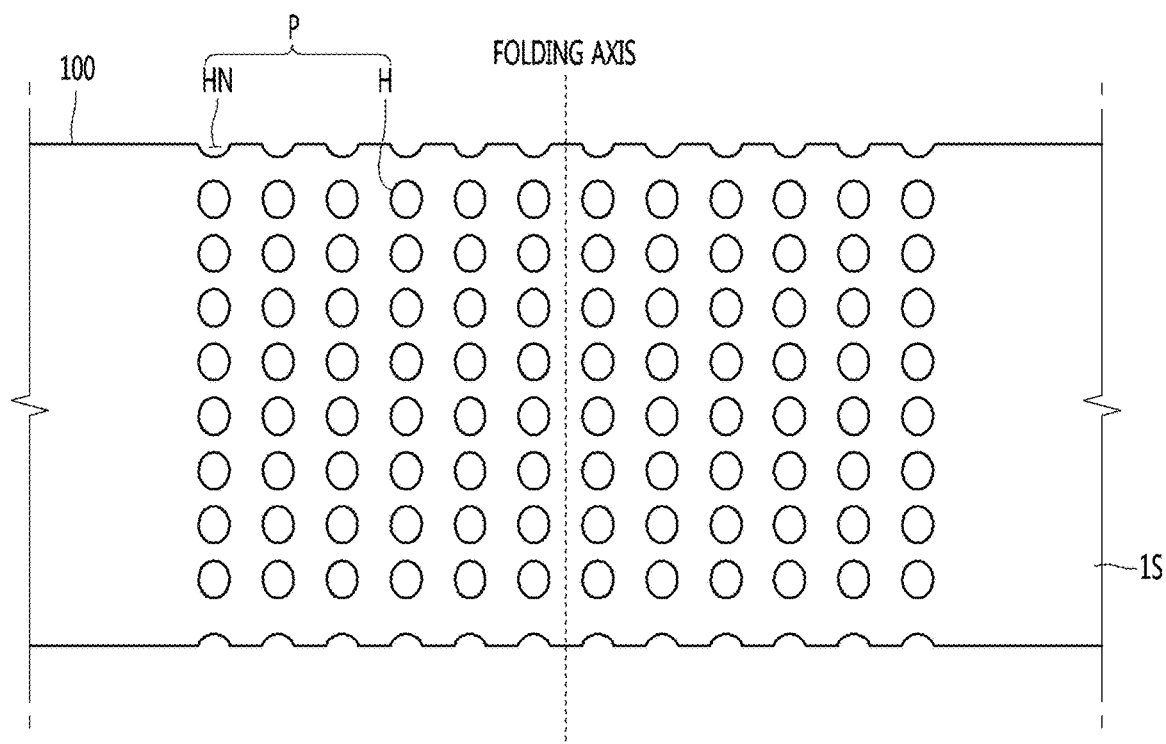
[FIG. 4]
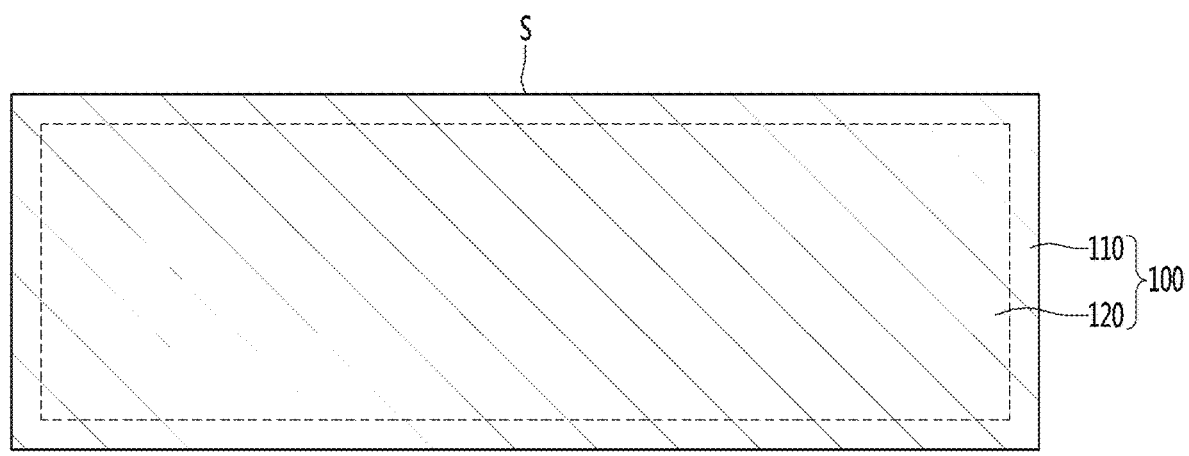

[FIG. 5]
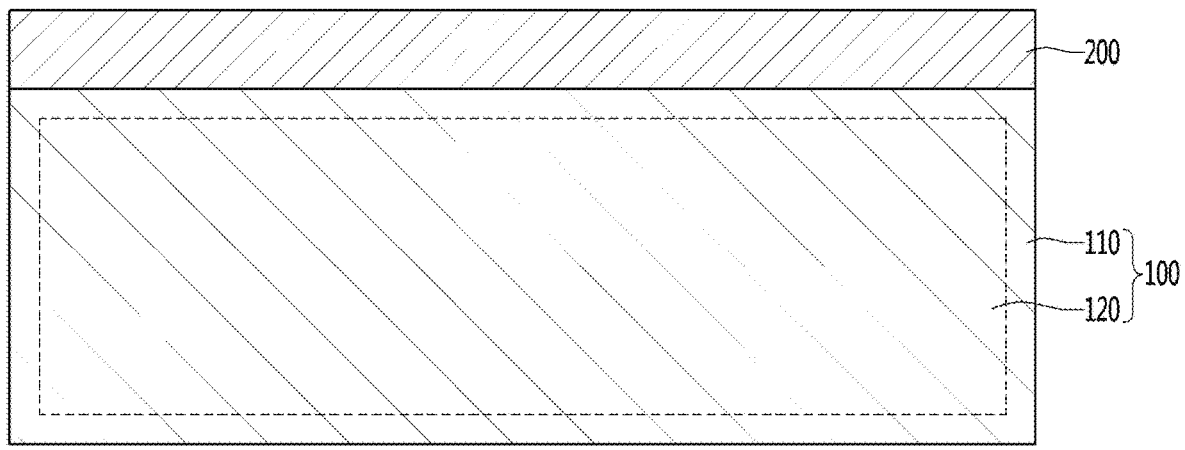
[FIG. 6]
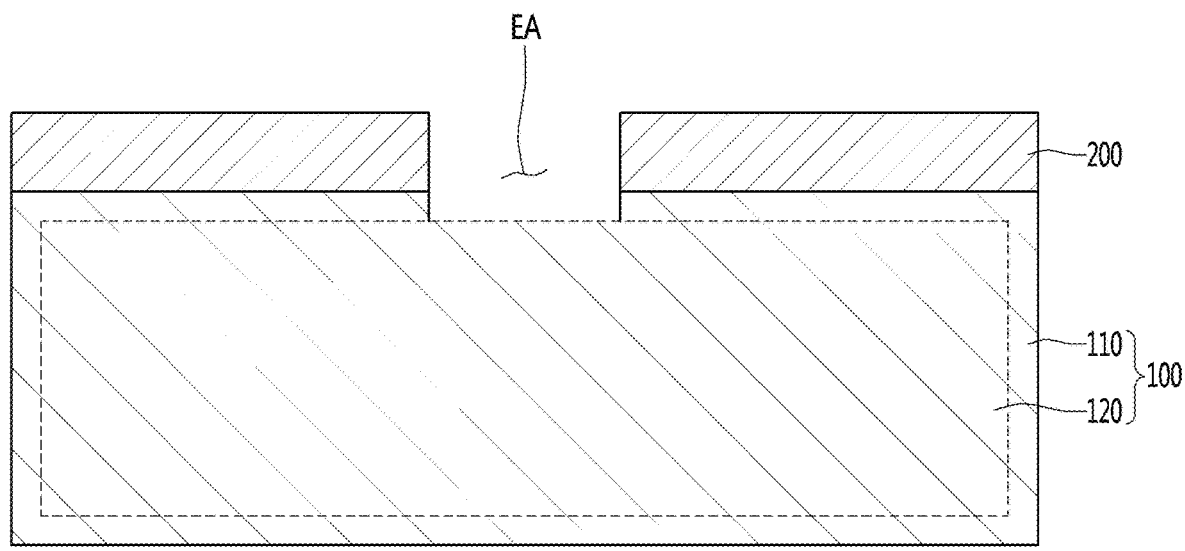

[FIG. 7]
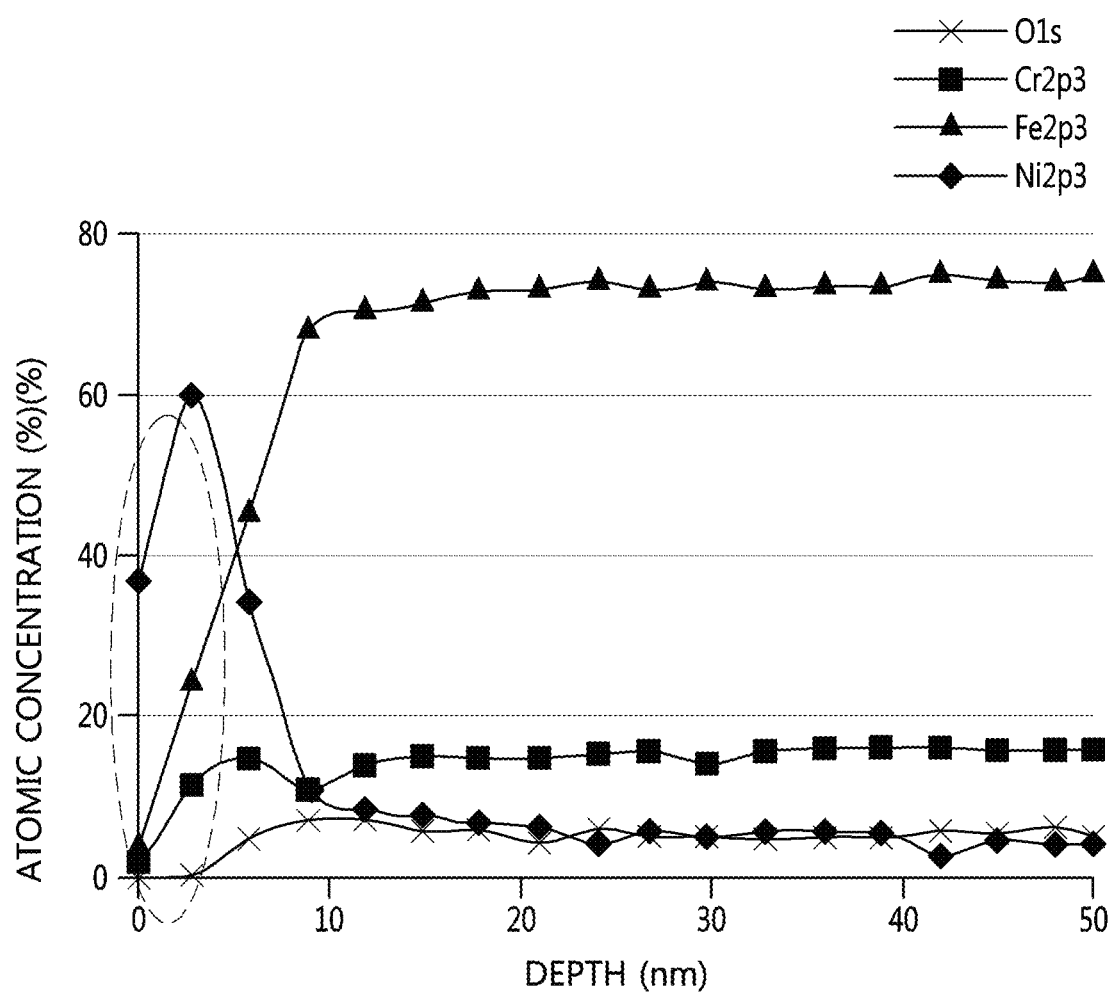

[FIG. 8]
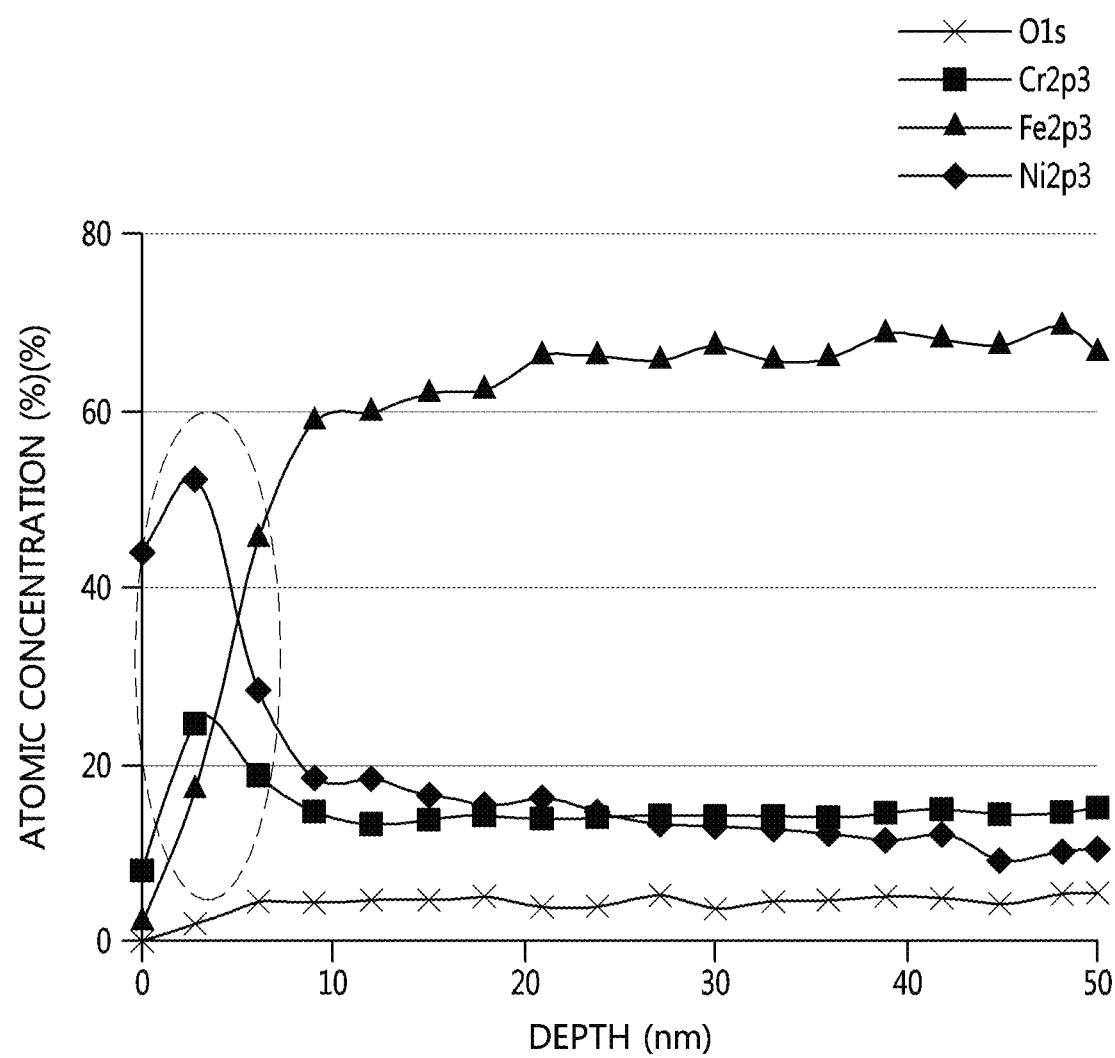

[FIG. 9]
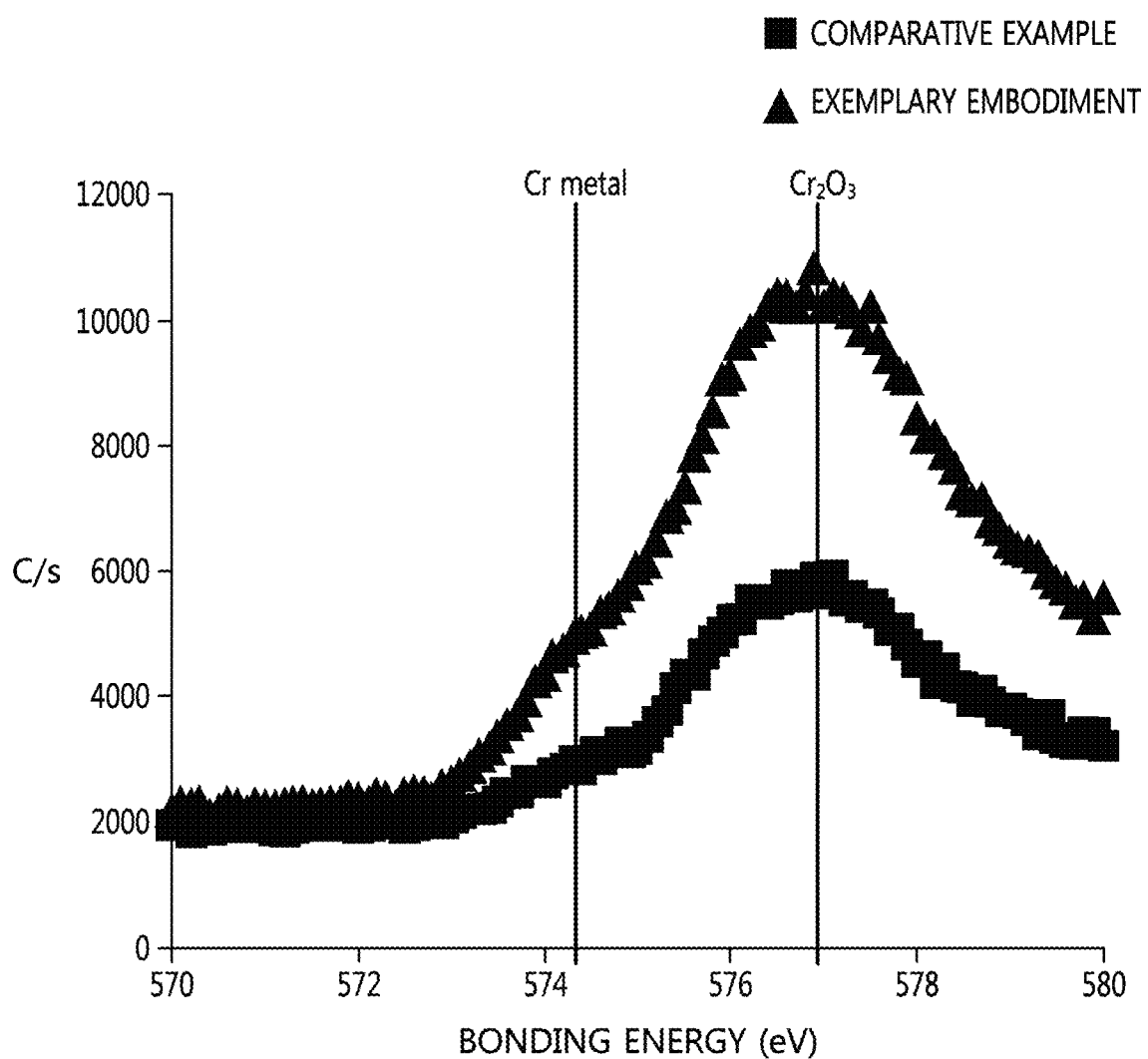

[FIG. 10]
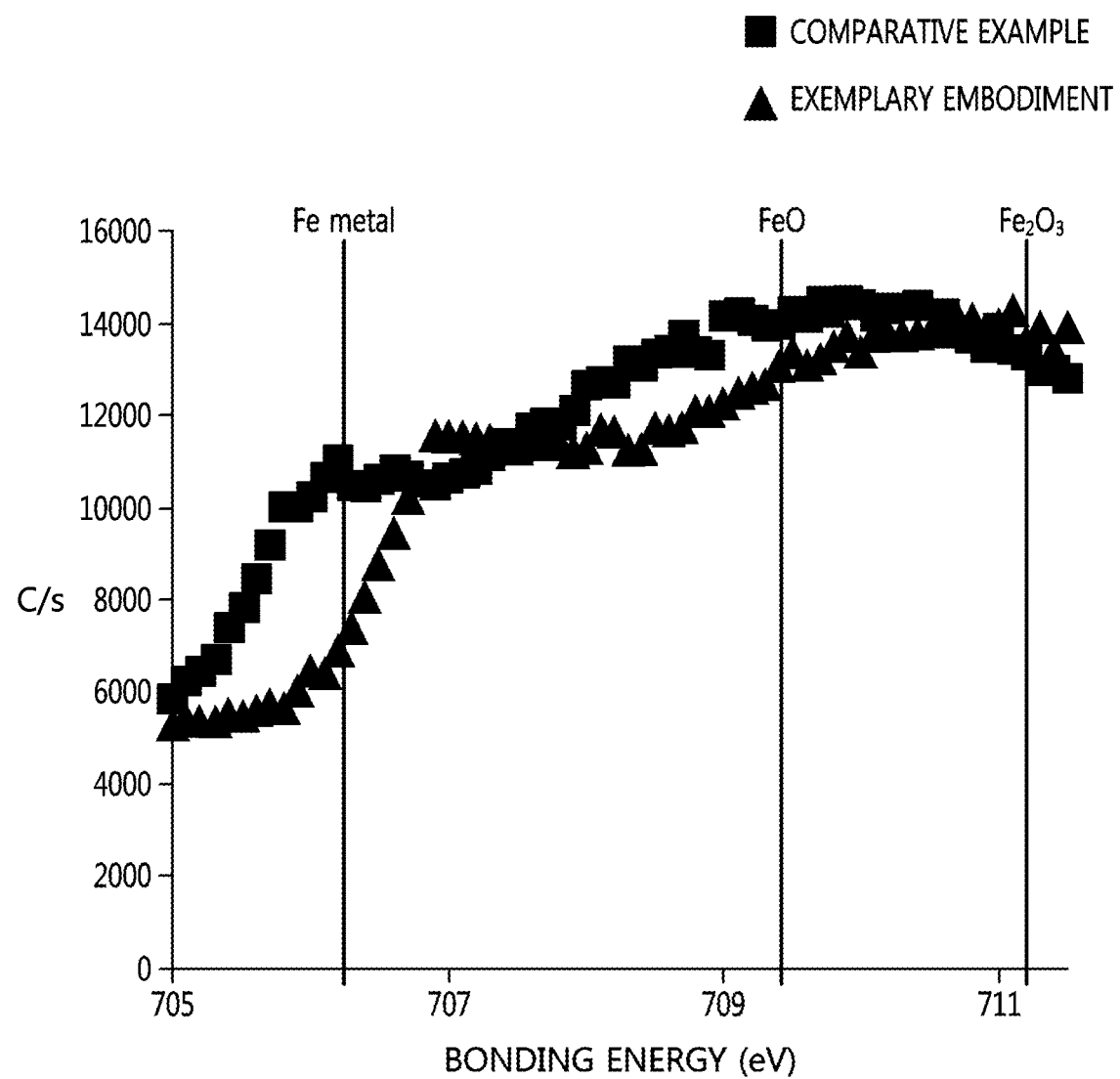

[FIG. 11]
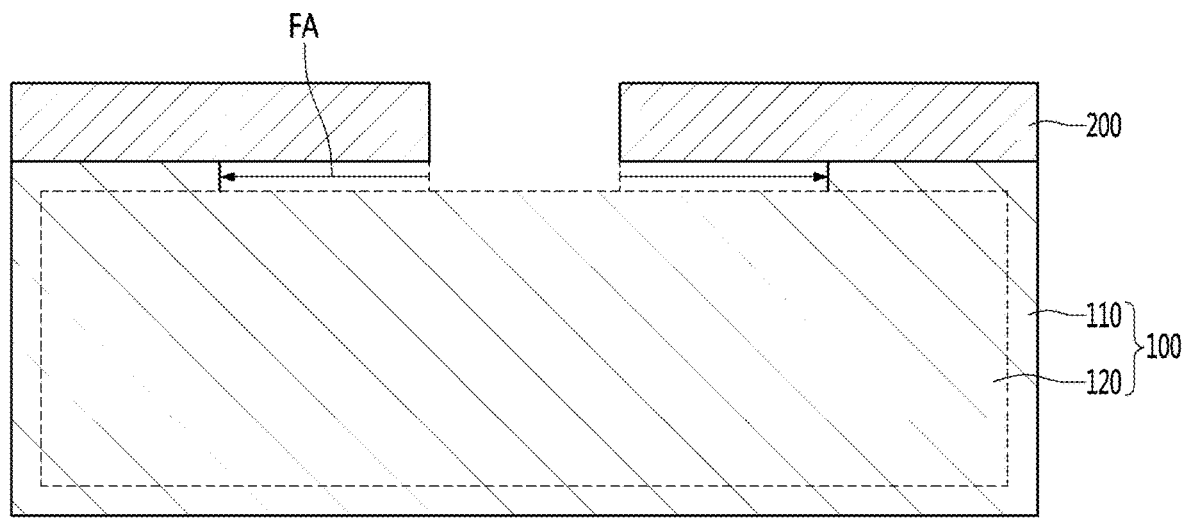
[FIG. 12]
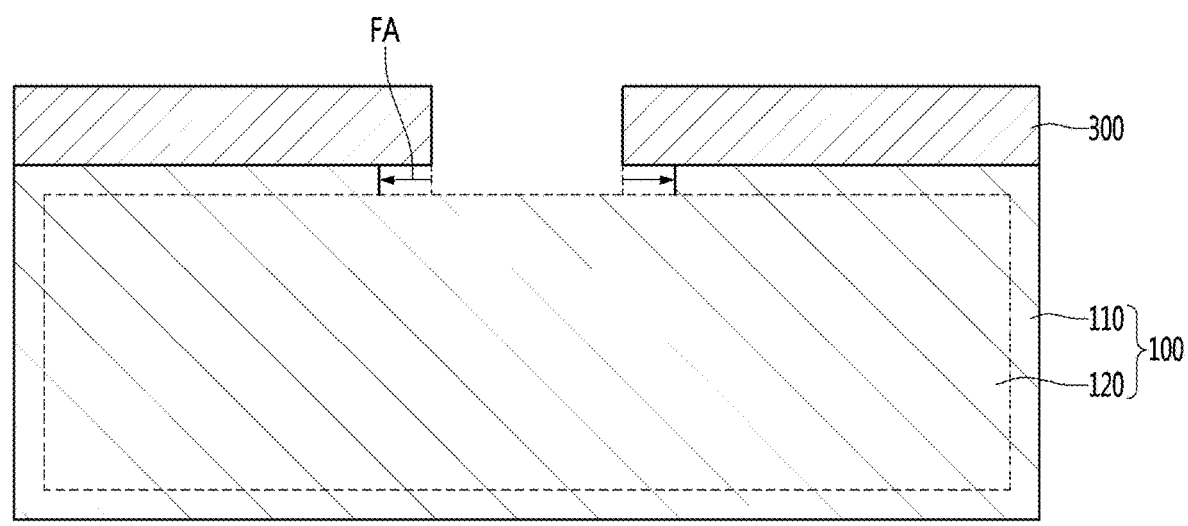

[FIG. 13]
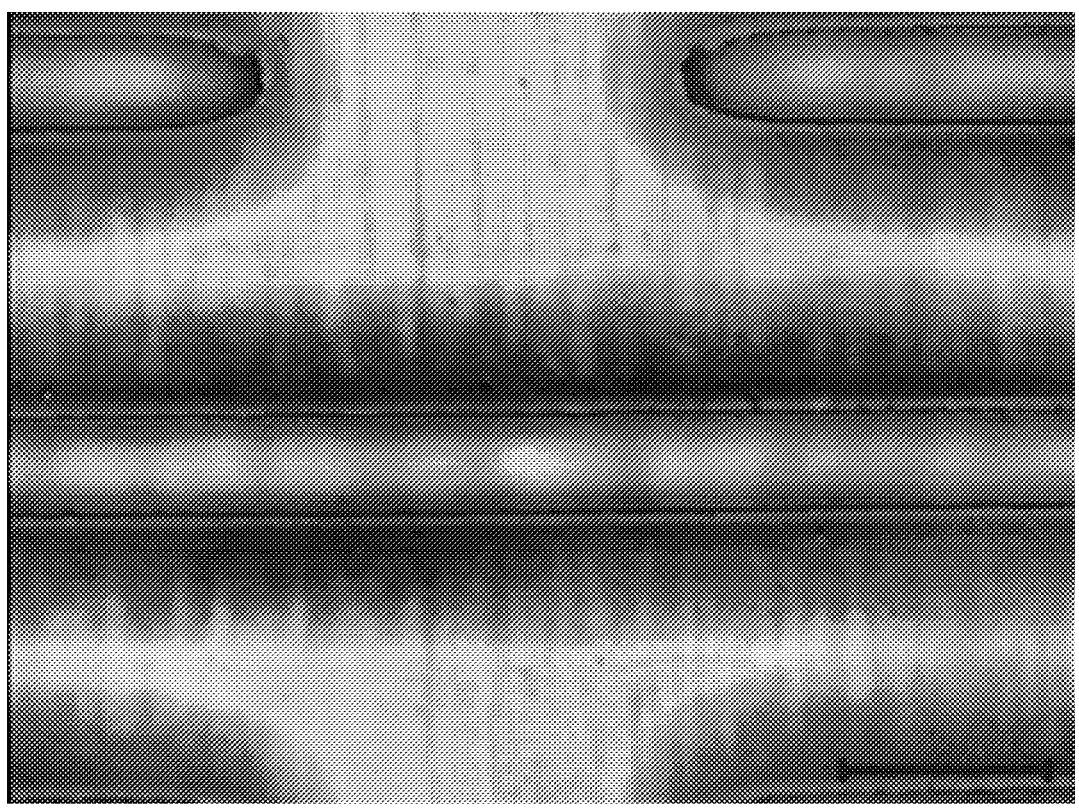

[FIG. 14]
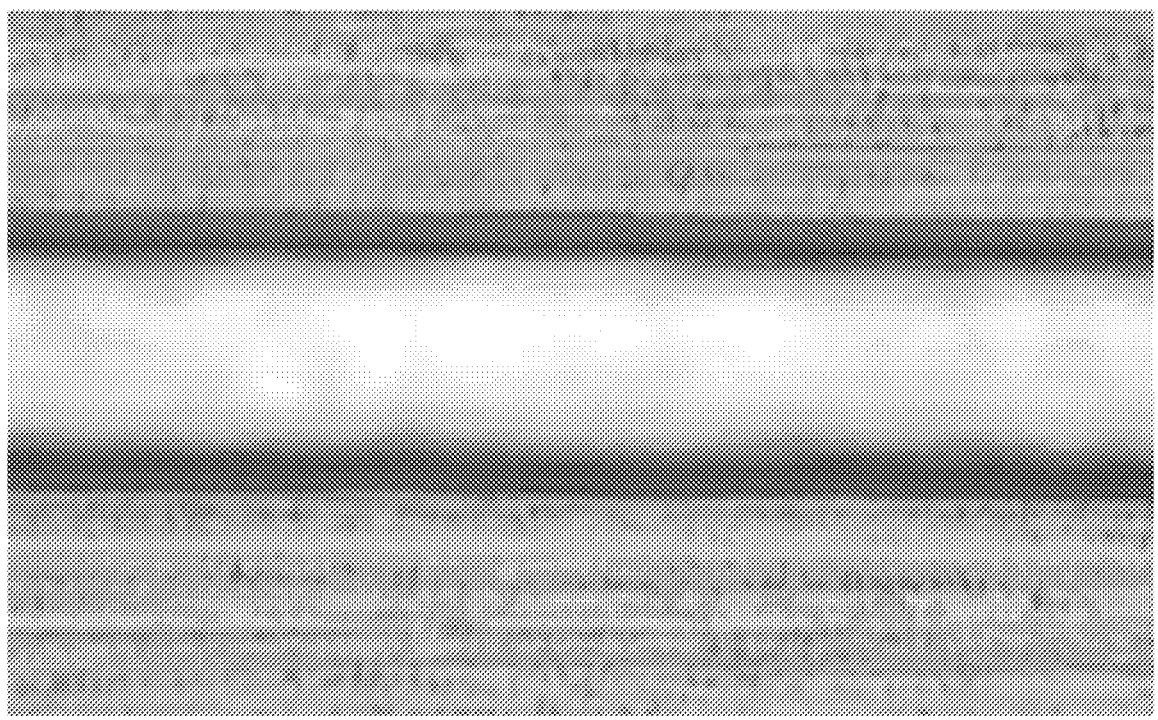

SUBSTRATE FOR DISPLAY

CROSS-REFERENCE TO RELATED PATENT APPLICATIONS

This application is a U.S. National Stage Application under 35 U.S.C. § 371 of PCT Application No. PCT/KR2020/001049, filed Jan. 22, 2020, which claims priority to Korean Patent Application No. 10-2019-0009764, filed Jan. 25, 2019, whose entire disclosures are hereby incorporated by reference.

TECHNICAL FIELD

Embodiments relate to a substrate for a display.

BACKGROUND

Recently, there is an increasing demand for a flexible display device capable of easily carrying various applications and displaying an image on a large screen when being carried.

Such a flexible display is folded or partially bent when being carried or stored, but may be implemented with the display unfolded when displaying images. Accordingly, the image display region may be increased, and a user may easily carry it.

Such a flexible display device may be repeatedly folded or bent, and then a restoration process of unfolding it again may be repeated.

Accordingly, a base material of the display device requires strength and elasticity, and cracks and deformations should not occur in the base material during folding and restoring.

To this end, in order to remove or reduce stress of a substrate constituting the display device, a plurality of pattern grooves or pattern holes may be formed in the entire region or one region of the substrate.

The stress generated when the substrate is folded or restored may be minimized by the pattern grooves or pattern holes to suppress occurrence of cracks or deformations in the substrate.

Meanwhile, a surface oxide layer due to natural oxidation may be naturally formed on a surface of such a substrate. After applying a photosensitive material to a substrate on which such a surface oxide layer is formed, the patterns may be formed using a photolithography process.

At this time, in the photolithography process, the surface oxide layer may be etched together, and the surface oxide layer may be over-etched, and thus adhesion between the photosensitive material and the surface oxide layer may be deteriorated, and crevice corrosion may occur in a region in which the surface oxide layer has been etched.

Therefore, a display substrate having a new structure capable of solving the above-described problems is required.

SUMMARY

An embodiment is directed to providing a display substrate that may prevent corrosion and may easily form a pattern.

A display substrate according to the embodiment includes a base material containing chromium and iron, wherein the base material includes a surface portion and a central portion, the surface portion is defined as a depth region from a surface of the base material to a depth of 5 nm in a thickness direction of the base material, and a ratio of chromium atoms to iron atoms (Cr/Fe) of the surface portion is greater than that of the central portion.

BRIEF DESCRIPTION OF THE DRAWINGS

FIG. 1 is a view illustrating a perspective view of a display substrate according to an embodiment.

FIG. 2 is a view illustrating a side surface view of a display substrate according to an embodiment.

FIG. 3 is a view illustrating a top view of one surface of a display substrate according to an embodiment.

FIG. 4 is a view illustrating a cross-sectional view of a display substrate according to an embodiment.

FIG. 5 is a view illustrating a cross-sectional view of a display substrate on which a photosensitive material is formed according to an embodiment.

FIG. 6 is a view illustrating a cross-sectional view of a display substrate from which a photosensitive material in a pattern region is removed according to an embodiment.

FIGS. 7 and 8 are graphs showing atomic concentrations of base materials according to Exemplary Embodiment and Comparative Example.

FIGS. 9 and 10 are graphs showing a distribution of bonding states of atoms of surface layers of the base materials according to the Exemplary Embodiment and the Comparative Example.

FIGS. 11 and 12 are views showing a degree to which an oxide layer of the base material according to the Exemplary Embodiment and the Comparative Example is peeled off.

FIGS. 13 and 14 are photographs for describing quality of etching after pattern formation of the base material according to the Exemplary Embodiment and the Comparative Example.

DETAILED DESCRIPTION OF THE EMBODIMENTS

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (A, and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a display substrate according to an embodiment will be described with reference to drawings.

Referring to FIGS. 1 to 3, a display substrate according to an embodiment includes a base material 100.

The base material 100 may include metals, metal alloys, plastics, composite materials (e.g., carbon fiber reinforced plastics, magnetic or conductive materials, glass fiber reinforced materials, etc.), ceramics, sapphire, glass, and the like. As an example, the base material 100 may include stainless steel (SUS).

Referring to FIGS. 1 and 2, the base material 100 may be bent in one direction. Specifically, the base material 100 including a first surface 1S and a second surface 2S may be folded in a direction in which any one of the first surface 1S and the second surface 2S faces each other with respect to a folding axis.

At this time, in case of the base material 100, since the base material 100 has both rigidity and ductility, compressive stress may be generated while bending in one direction, and there is a problem that cracks occur in the base material 100 in a region in which the compressive stress is large.

Referring to FIG. 3, in order to solve such a problem, a plurality of patterns may be formed in one region of the base material 100. Specifically, patterns P including a plurality of grooves or holes H may be formed in one region of the base material 100.

Such patterns P may be formed in at least one region of a folding portion and an unfolding portion of the base material 100.

In addition, a plurality of hinge portions HN may be formed at both ends of the base material 100 to easily bend the base material 100.

The patterns P and the hinge portions HN may be formed through exposure, development, and etching processes after forming a photosensitive material on the base material 100.

In this case, the photosensitive material may be formed on a surface portion 110 on the base material 100, and the surface portion 110 may be etched together when etching the base material 100.

The surface portion 110 may be formed on a surface of the base material 100 to serve as a protective layer to prevent corrosion of the base material due to external oxygen.

Meanwhile, when the surface portion 110 is over-etched during the etching process, since the surface portion does not remain in an over-etched region, crevice corrosion may occur between the base material 100 and the photosensitive material.

In addition, a contact region between the surface portion and the photosensitive material may be reduced, and adhesion between the surface portion and the photosensitive material may be deteriorated, and thus the photosensitive material may be peeled off.

Accordingly, the reliability and durability of the display substrate may be degraded, and a pattern having an incorrect size and shape is formed, and thus stress distribution by the pattern during folding may not be performed effectively.

A display substrate according to an embodiment described below may prevent an over-etching of a surface portion generated during such an etching process to prevent corrosion, thereby forming a more precise pattern.

Hereinafter, a display substrate according to an embodiment will be described in detail with reference to FIGS. 4 to 14.

Referring to FIG. 4, the display substrate 1000 may include a base material 100.

As described above, the base material 100 may include a material having rigidity and ductility. For example, the base material 100 may include stainless steel (SUS).

Specifically, the base material 100 may include at least one material of carbon (C), silicon (Si), manganese (Mn), phosphorus (P), sulfur (S), chromium (Cr), nickel (Ni), and iron (Fe).

The base material 100 may include stainless steel (SUS) including about 10 wt % or more of chromium. More specifically, the base material 100 may include stainless steel (SUS) including about 11 wt % to about 20 wt % of chromium.

Specifically, the base material 100 may include stainless steel (SUS) containing about 0.15 wt % or less of carbon, about 1 wt % or less of silicon, about 2 wt % or less of manganese, about 0.045 wt % or less of phosphorus, about 0.03 wt % or less of sulfur, about 6 wt % to about 8 wt % of nickel, and iron as a balance.

The base material 100 may include two regions defined by depth. In detail, the base material 100 may be defined as a region of a surface portion 110 defined as a region from a surface S of the base material 100 to 5 nm in the thickness direction of the base material 100 and a region of a central portion 120 inside of the surface portion.

As described above, the base material 100 includes various compositions, but most of the content is made of iron (Fe).

Accordingly, the base material 100 may combine with oxygen in the air in a natural state to form an oxide film on the surface thereof. That is, the surface portion 110 may be defined as a surface oxide film formed on the surface of the base material 100.

The surface portion 110 may be formed on the entire surface of the base material 100. That is, it may be formed on an upper surface, a lower surface, and side surfaces of the base material exposed to the outside.

Accordingly, the surface portion 110 may be formed in a shape surrounding the central portion 120.

Meanwhile, the surface portion 110 may be formed in a constant thickness. For example, the surface portion 110 may have a thickness of about 10 nm to about 100 nm in a thickness direction of the base material 100.

Meanwhile, referring to FIG. 5, a photosensitive material 200 such as a photoresist may be applied on the base material 100, that is, on the surface portion 110 in order to form a pattern having a hole or groove shape in one region of the base material 100.

Subsequently, as shown in FIG. 6, the photosensitive material 200 of a region EA to be etched through exposure and development processes may be removed.

Subsequently, the region from which the photosensitive material 200 has been removed may be etched by an etching solution capable of etching the base material 100. In detail, the surface portion 110 and the central portion 120 may be etched together by the etching solution. In this case, when the surface portion 110 is over-etched by the etching solution, adhesion between the surface portion 110 and the photosensitive material 200 may be deteriorated, and corrosion may occur in a gap portion.

The display substrate 1000 according to the embodiment may control the composition of the surface portion 110 in order to prevent deteriorating of the adhesion between the surface portion and the photosensitive material and corrosion.

Specifically, the surface portion 110 may include iron oxides such as FeO and $Fe_2O_3$ and chromium oxide of $Cr_2O_3$. The display substrate 1000 according to the embodiment may solve the above problems by controlling atomic concentrations of chromium and iron atoms of the surface portion 110.

Specifically, the surface portion 110 may have a higher ratio of chromium atoms to iron atoms (Cr/Fe) than that of the central portion 120. In detail, the surface portion 110 may have a ratio of chromium atoms to iron atoms (Cr/Fe) of about 0.7 or more.

That is, the surface portion 110 may include a region in which the ratio of chromium atoms to iron atoms (Cr/Fe) is 0.7 or more. For example, the ratio of chromium atoms to iron atoms (Cr/Fe) may be 0.7 or more in at least one of the entire regions of the surface portion 110.

In addition, the ratio of chromium atoms to iron atoms (Cr/Fe) may be 1 or more in at least one of the entire regions of the surface portion 110.

In addition, the ratio of chromium atoms (Cr/Fe) to iron atoms may be 0.7 to 3.2 in at least one of the entire regions of the surface portion 110.

For example, the surface portion 110 may have a ratio of chromium atoms to iron atoms (Cr/Fe) of 1 or more at a depth from the surface of the base material 100 to 3 nm in the depth direction of the base material 100.

In addition, the surface portion 110 may have a ratio of chromium atoms to iron atoms (Cr/Fe) of 0.7 or more at a depth from 3 nm to 5 nm in the depth direction of the base material 100 from the surface of the base material 100.

That is, the ratio of chromium atoms to iron atoms (Cr/Fe) may be higher as the surface portion 110 is closer to the surface of the base material 100.

That is, the ratio of chromium atoms to iron atoms (Cr/Fe) may be gradually increased as the surface portion 110 is closer to the surface of the base material 100.

That is, the ratio of chromium atoms to iron atoms (Cr/Fe) in the entire region of the surface portion 110 may be 0.7 or more.

Accordingly, the surface portion 110 may be a chromium-rich region having a higher content of chromium (Cr) than the central portion 120, and may include a chromium-rich region.

Such a chromium-rich region of the surface portion 110 may be artificially formed. That is, the surface and oxygen in the air are combined on the base material 100 to form an oxide layer by natural oxidation first, and the oxide layer is subjected to an acid treatment with a solution such as hydrochloric acid and a heat treatment to change one region of the surface portion 110, that is, at least one region of the surface portion 110 into a chromium-rich region.

Since chromium (Cr) or a chromium oxide film has better corrosion resistance than iron (Fe) or an iron oxide film, the surface portion 110 may be prevented from being over-etched inward by an etching solution or the like during an etching process.

That is, the photosensitive material 200 is adhered to the surface portion 110, and accordingly, it is possible to prevent the surface portion 110 from being over-etched by the etchant or the like during an etching process by adjusting the composition of the surface portion 110 to a chromium-rich state. In addition, it is possible to prevent a deterioration in adhesion between the surface portion 110 and the photosensitive material 200 due to over-etching of the surface portion.

Meanwhile, the ratio of chromium atoms to iron atoms (Cr/Fe) at the central portion 120 may be smaller than that at the surface portion 110.

Specifically, the central portion 120 may have a ratio of chromium atoms to iron atoms (Cr/Fe) of less than 1. In detail, the ratio of chromium atoms to iron atoms (Cr/Fe) in the central portion 120 may be 0.3 to 0.6. That is, the central portion 120 may include a region in which the ratio of chromium atoms to iron atoms (Cr/Fe) is 0.3 to 0.6.

Accordingly, the central portion 120 may be in an iron-rich state unlike the surface portion 110. When the ratio of chromium atoms to iron atoms (Cr/Fe) in the central portion 120 exceeds 0.6, the corrosion resistance in the central portion 120 is increased to decrease an etching rate, and accordingly, etching efficiency during the etching process may be lowered, and thus pattern formation may be difficult.

That is, in the surface portion 110 adhered to the photosensitive material, the corrosion resistance of the surface portion may be increased to prevent over-etching, and in the central portion 120, the corrosion resistance may be relatively reduced as compared with the surface portion, and thus the composition of the base material 100 may be controlled such that the base material 100 is easily etched.

Meanwhile, the display substrate according to the embodiment may be defined as a region in which a curvature is generated by folding of the display substrate and a region in which the curvature is not generated without folding. The pattern may be formed in both the region in which the curvature is generated and the region in which the curvature is not generated. Alternatively, the pattern may be formed only in the region in which the curvature is generated. Accordingly, the base material 100 may be divided into a region in which a pattern is formed and a region in which a pattern is not formed.

The chromium and iron concentrations of the surface portion may be controlled in both the region in which the pattern is formed and the region in which the pattern is not formed. Alternatively, the chromium and iron concentrations of the surface portion may be controlled only in the region in which the pattern is formed.

That is, since over-etching of the photosensitive material occurs in the etching process of forming the pattern, a process time according to reforming of the surface portion may be reduced by controlling the concentration of chromium and iron atoms only in the region in which the pattern is formed in the region of the base material.

In the above description, the description has been made focusing on that the display substrate 1000 is warped, but the embodiment is not limited thereto, and the embodiment may be applied when forming a pattern on the display substrate 1000 which is not warped, or when forming a pattern on a base material used for a purpose other than the display substrate, for example, for a purpose such as a mask, and its application field is not limited to the above description.

Hereinafter, the present invention will be described in more detail with reference to Exemplary Embodiments and Comparative Examples. The Exemplary Embodiments are merely illustrative for describing the present invention in more detail. Therefore, the present invention is not limited to thereto.

Exemplary Embodiment

First, a stainless steel base material was prepared.

The stainless steel base material contained 17 wt % of chromium.

Subsequently, a surface of the stainless steel base material was bonded to oxygen in the air and spontaneously oxidized, and a surface oxidized region was formed on the surface of the base material. Subsequently, the surface of the stainless steel base material was subjected to an acid treatment using hydrochloric acid, and then heat-treated at a temperature of about 150° C. to reform the surface oxidized region of the base material.

Subsequently, after a photoresist material was applied to the surface of the stainless steel base material, the photoresist material of a region to be patterned was removed through exposure and development processes.

Meanwhile, a heat treatment process may be performed before and after the development process. In detail, reaction sensitivity may be increased through diffusion of a photosensitive agent through heat treatment after the exposure process, and surface roughness may be reduced by reducing the surface roughness of the surface portion after development through heat treatment after the development process.

Subsequently, the stainless steel base material was etched using an etchant for etching a pattern formation region.

Subsequently, an atomic concentration according to the depth from the surface of the stainless steel base material, a bonding state of atoms, and a degree of etching of the surface portion were measured.

Comparative Example

The same stainless steel base material as in the Exemplary Embodiment was prepared. Subsequently, the surface of the stainless steel base material was naturally oxidized, and a surface oxidized region was formed on the surface of the base material.

Subsequently, after a photoresist material was applied to the surface of the base material, the photoresist material in a region in which a pattern was to be formed was removed through exposure and development processes.

Subsequently, the stainless steel base material was etched using an etchant for etching a pattern formation region.

That is, in the Comparative Example, the etching process was performed without performing the acid treatment and the heat treatment, unlike in the Exemplary Embodiment.

Subsequently, an atomic concentration according to the depth from the surface of the stainless steel base material, a bonding state of atoms, and a degree of etching of the surface portion were measured.

FIGS. 7 and 8 are graphs showing an atomic concentration according to a depth from a surface of a stainless steel base material according to each of Exemplary Embodiment and Comparative Example measured by X-ray photoelectron spectroscopy (XPS).

Referring to FIG. 7, it may be seen that the base material according to the Comparative Example has a higher iron content than a chromium content at a depth from the surface (0 nm) to about 5 nm. That is, it may be seen that the base material according to the Comparative Example is in an iron-rich state having a high iron content at a depth from the surface (0 nm) to about 5 nm.

Referring to FIG. 8, it may be seen that the base material according to the Exemplary Embodiment has a higher chromium content than an iron content at a depth from the surface (0 nm) to about 5 nm. That is, it may be seen that the base material according to the Exemplary Embodiment is in a chromium-rich state having a high chromium content at a depth from the surface (0 nm) to about 5 nm.

The atomic concentration according to the depth of the base material according to the Exemplary Embodiment may be as shown in Table 1 below.

TABLE 1

| Depth (nm) | Atomic concentration (%) | | | |
|---|---|---|---|---|
| | O1s | Cr2P3 | Fe2P3 | Ni2P3 |
| 0 | 51.3414 | 14.0089 | 4.4374 | 0.1224 |
| 3 | 4936837 | 25.6722 | 21.1005 | 2.1805 |
| 5 | 39.8000 | 20.3000 | 29.0000 | 10.90000 |
| 6 | 22.2638 | 18.9456 | 53.8546 | 4.9361 |
| 9 | 11.9097 | 14.4952 | 67.3275 | 6.0810 |
| 12 | 9.4319 | 14.3277 | 70.5415 | 3.9239 |
| 15 | 8.0446 | 13.8450 | 70.4111 | 4.7304 |
| 18 | 7.3511 | 13.8165 | 73.5573 | 5.1607 |
| 21 | 6.0022 | 14.4993 | 73.0769 | 5.1723 |
| 24 | 5.2749 | 15.1194 | 73.9616 | 5.6441 |
| 27 | 5.6255 | 16.2105 | 72.9753 | 5.1478 |
| 30 | 5.5839 | 14.6037 | 74.8789 | 4.9336 |
| 33 | 4.5958 | 15.2280 | 72.8422 | 5.0024 |
| 36 | 3.1684 | 15.9637 | 75.9920 | 4.8759 |
| 39 | 3.9479 | 17.0497 | 72.5544 | 5.1806 |
| 42 | 2.8363 | 15.2671 | 75.2987 | 5.4548 |
| 45 | 2.9084 | 16.2561 | 75.4045 | 5.0812 |
| 48 | 1.4864 | 1634783 | 76.4167 | 5.6186 |
| 51 | 2.8772 | 16.7165 | 75.3340 | 5.0680 |

Referring to FIG. 8 and Table 1, it may be seen that the base material according to the Exemplary Embodiment has a chromium-to-iron ratio (Cr/Fe) of 0.7 or more at a depth from the surface (0 nm) to about 5 nm. In addition, it may be seen that the chromium-to-iron ratio (Cr/Fe) is less than 0.7 from a depth of about 5 nm of the base material.

That is, at a depth from the surface (0 nm) which is a region in which the photosensitive material is adhered to the surface of the base material to about 5 nm, it is possible to prevent the surface portion from being over-etched during the etching process by increasing an amount of chromium having strong corrosion resistance. Accordingly, it is possible to prevent adhesion between the surface portion and the photosensitive material from being deteriorated due to over-etching, and prevent corrosion from occurring in a region to be over-etched.

In addition, the etching process may be performed smoothly by reducing the amount of chromium having strong corrosion resistance and increasing the iron content from the depth of 5 nm of the base material, thereby forming a pattern more precisely.

FIGS. 9 and 10 are graphs showing bonding states of chromium and iron atoms according to the Exemplary Embodiment and the Comparative Example measured at a region of 3 nm from the surface of the base material in the depth direction, that is, at a distance of 3 nm spaced apart from the surface of the base material, which are measured through bonding energy analysis.

Referring to FIG. 9, it may be seen that in the base material according to the Exemplary Embodiment, a ratio of chromium oxide having strong corrosion resistance on the surface portion is increased nearly twice as compared with the Comparative Example.

In addition, referring to FIG. 10, it may be seen that in the base material according to the Exemplary Embodiment, a ratio of the iron oxide film on the surface portion is similar to that of the Comparative Example.

That is, in the base material according to the Exemplary Embodiment is in a chromium-rich state in which a chromium content is high at a depth from the surface (0 nm) to about 5 nm, and particularly, since chromium atoms remain in a chromium oxide state having strong corrosion resistance, it is possible to effectively prevent the surface oxide layer from being over-etched during the etching process.

FIGS. 11 to 14 are cross-sectional views and photographs showing a degree to which the base material is etched during the etching process of the base material according to the Exemplary Embodiment and Comparative Example.

Referring to FIG. 11, in a display substrate according to the Comparative Example, it may be seen that a region FA in which a surface portion is etched inward during an etching process is large. On the other hand, referring to FIG. 12, in a display substrate according to the Exemplary Embodiment, it may be seen that a region FA in which a surface portion is etched inward during an etching process is small.

That is, in the display substrate according to the Comparative Example, as shown in FIG. 13, the region FA in which the surface portion is etched inward is increased, and corrosion may occur in the region FA in which the surface portion is etched inward. In addition, it may be seen that the surface portion is over-etched inward, a contact region between the photosensitive material and the surface portion is reduced, and adhesion between the photosensitive material and the base material is deteriorated.

However, in the display substrate according to the Exemplary Embodiment, as shown in FIG. 14, it is possible to prevent corrosion from occurring in the region FA in which the surface portion is etched inward by minimizing the region FA in which the surface portion is etched inward. In addition, it is possible to prevent the contact region between the surface portion and the photosensitive material from being reduced by minimizing the region in which the surface portion is etched inward, and accordingly, it is possible to prevent adhesion between the photosensitive material and the base material from being deteriorated.

In the display substrate according to the embodiment, it is possible to prevent crevice corrosion generated when the surface portion is over-etched during etching of the base material and deterioration in adhesion to the photosensitive layer by controlling the atomic concentration of the surface portion of the base material.

Specifically, the concentration of chromium oxide of the surface portion in contact with the photosensitive layer may be increased by reforming the surface portion.

Accordingly, the corrosion resistance of the surface portion in the surface portion may be increased by increasing the content of chromium oxide in the surface portion.

Accordingly, it is possible to minimize a phenomenon that the surface portion is over-etched inward during the etching process, and prevent deterioration in adhesion due to a decrease in a contact region between the surface portion and the photosensitive layer due to over-etching of the surface portion.

In addition, it is possible to easily realize a desired pattern shape by smoothly proceeding the etching process by reducing the atomic concentration of chromium and increasing the atomic concentration of iron from a region other than the surface portion.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, although the above description been focused on the embodiments, the embodiments are merely examples and does not limit the present invention. It will be apparent to those skilled in the art that various modifications and applications not illustrated above may be made without departing from the essential features of the present embodiment. For example, elements of the exemplary embodiments described herein may be modified and realized. Also, it should be construed that differences related to such changes and applications are included in the scope of the present invention defined in the appended claims.

What is claimed is:

1. A display substrate comprising:
a base material containing chromium in a content of 10 wt % or more, iron, and nickel in a content of 6 wt % to 8 wt %, and foldable based on a folding axis,
wherein a content of the iron is greater than the content of each of the chromium and the nickel,
wherein the base material includes a first region including the folding axis and adjacent to the folding axis, and a second region positioned farther from the folding axis than the first region and other than the first region,
wherein a hole or a groove is formed in the first region of the base material,
wherein the first region of the base material includes a surface portion and a central portion,
wherein the hole or the groove is formed in the surface portion and the central portion;
the surface portion is defined as a depth region from a surface of the base material to a depth of 5 nm in a thickness direction of the base material,
wherein the surface portion has a ratio of chromium atoms to iron atoms (Cr/Fe) of 0.7 to 3.2,
wherein the ratio of chromium atoms to iron atoms (Cr/Fe) in the surface portion increases toward the surface of the base material,
wherein the surface portion has a ratio of chromium atoms to iron atoms (Cr/Fe) of 1 or more at a depth from the surface of the base material to 3 nm in a depth direction of the base material,
wherein the surface portion has a ratio of chromium atoms to iron atoms (Cr/Fe) of 0.7 or more at a depth from 3 nm to 5 nm in the depth direction of the base material from the surface of the base material,
wherein the central portion is a region in which the ratio of chromium atoms to iron atoms (Cr/Fe) is 0.3 to 0.6,
wherein an atomic concentration of the chromium in the surface portion increases and then decreases toward the surface of the base material,
wherein an atomic concentration of the iron in the surface portion decreases toward the surface of the base material, and
wherein an atomic concentration of the nickel in the surface portion decreases toward the surface of the base material.

2. The display substrate of claim 1, wherein the chromium atoms of the surface portion are included in a chromium oxide state.

3. The display substrate of claim 1, wherein a hole or a groove is further formed in the second region, and in the second region, the ratio of chromium atoms to iron atoms (Cr/Fe) of the surface portion is greater than that of the central portion.

4. The display substrate of claim 1, wherein the base material further includes 0.15 wt % or less of carbon, 1 wt % or less of silicon, 2 wt % or less of manganese, 0.045 wt % or less of phosphorus, and 0.03 wt % or less of sulfur.

5. The display substrate of claim 1, wherein the surface portion is formed in a shape surrounding the central portion,
    wherein the surface portion includes an oxide layer.

6. The display substrate of claim 5, wherein the surface portion includes $FeO$, $Fe_2O_3$ or $Cr_2O_3$.

7. The display substrate of claim 1, wherein the base material includes stainless steel (SUS).

\* \* \* \* \*